Figure 1:
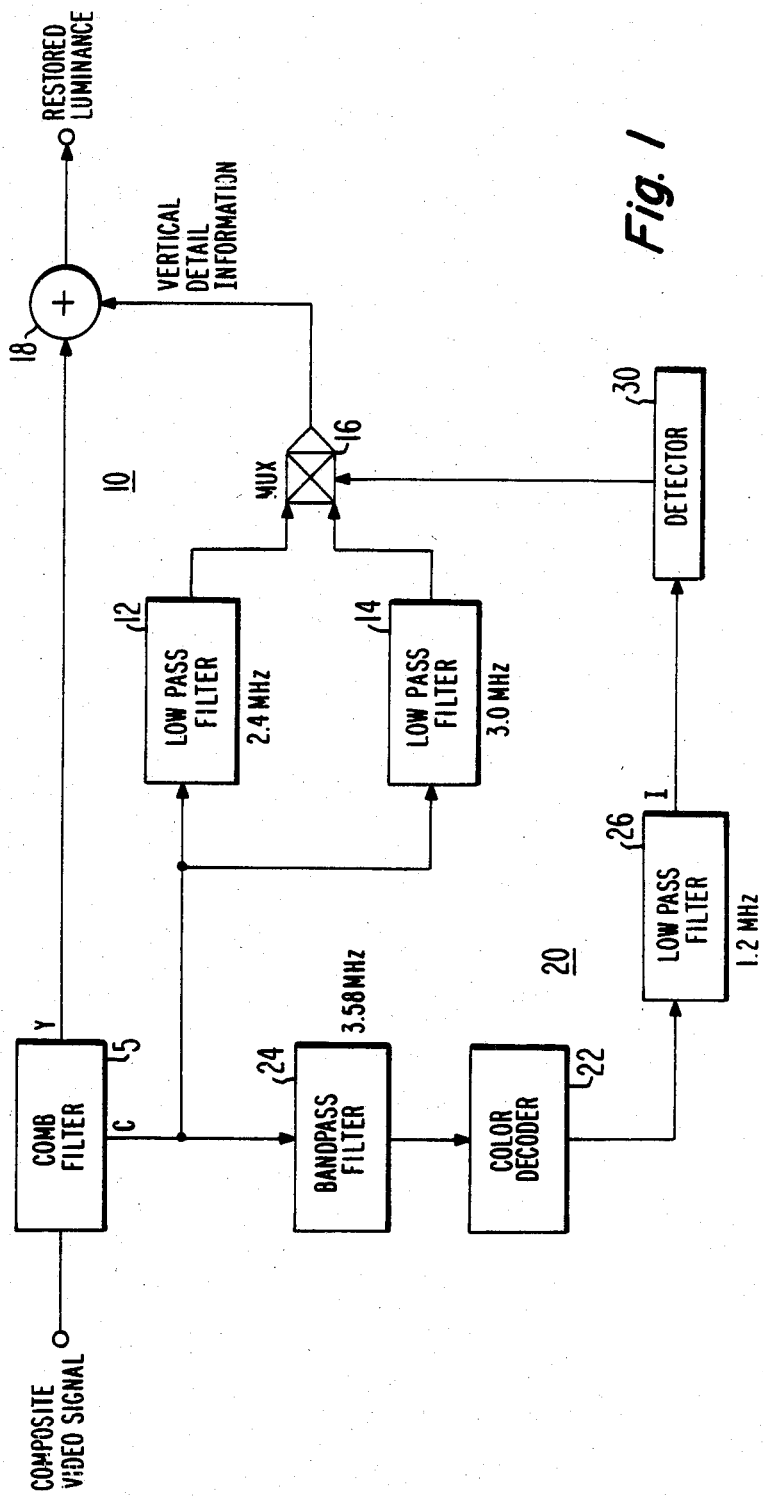

United States Patent [19]

Harwood et al.

[11] Patent Number: 4,670,665

[45] Date of Patent: Jun. 2, 1987

[54] DIGITAL PULSE WIDTH DETECTOR

[75] Inventors: Leopold A. Harwood, Bridgewater; Robert A. Wargo, Ringoes, both of N.J.

[73] Assignee: RCA Corporation, Princeton, N.J.

[21] Appl. No.: 760,911

[22] Filed: Jul. 31, 1985

[51] Int. Cl.⁴ .......................... H03K 5/22; H03K 5/13
[52] U.S. Cl. .................................... 307/234; 307/602; 328/112
[58] Field of Search ...................... 307/234, 602, 595; 328/111, 112; 329/106

[56] References Cited

U.S. PATENT DOCUMENTS 4,061,976  9/1976  Sugai .
4,567,601  1/1986  Mountain ........................ 328/111
4,583,008  4/1986  Grugett .......................... 307/234

Primary Examiner—Stanley D. Miller
Assistant Examiner—Trong Quang Phan
Attorney, Agent, or Firm—Paul J. Rasmussen; Eric P. Herrmann; David N. Caracappa

[57] ABSTRACT

Apparatus for passing digital pulses from a bilevel digital signal source having widths wider than a given minimum and narrower than a given maximum is described. A first duration sensitive signal gate is coupled to the signal source and passes only signals having widths wider than the given minimum duration. A second duration sensitive signal gate is also coupled to the signal source and passes only signals having widths equal to or wider than the given maximum duration. A signal selection means is coupled to the first and second duration sensitive signal gates, and passes pulses which have been passed by the first but not the second duration sensitive signal gate.

4 Claims, 2 Drawing Figures

DIGITAL PULSE WIDTH DETECTOR

The present invention relates generally to a digital signal gate which is sensitive to the duration of a digital signal applied to it.

It is sometimes required that the duration of a bilevel digital signal affects the processing of a digital signal processing system. For example, copending U.S. patent application of L. A. Harwood and R. A. Wargo, entitled "VERTICAL DETAIL INFORMATION RESTORATION CIRCUIT", and filed concurrently herewith, discloses a circuit for restoring vertical detail information from a comb filtered chrominance signal to a comb filtered luminance signal. In this copending application, the presence or absence of information in a particular frequency band of the baseband color difference signal affects the restoration of the vertical detail information by varying the band-width of the vertical detail information so restored.

In the circuit described in the above-mentioned application, the signal in which information in the particular band of frequencies is desirably detected is digitized, and the duration of the pulses of the digitized signal is detected. It is an object of the present invention to detect pulses corresponding to signals in a particular band of frequencies.

In accordance with the principles of the present invention a first duration sensitive signal gate passes only pulses from a source of digital signals with widths greater than a first given duration. A second duration sensitive signal gate, coupled to the source of digital signals, passes only pulses with widths greater than a second given duration which is greater than the first given duration. A signal selection means, coupled to the first and second duration sensitive signal gates passes only pulses which have passed through the first, but not through the second duration signal gate.

Apparatus constructed according to the present invention will pass only pulses longer than a given minimum and shorter than a given maximum. Such apparatus may be used to detect signals within a given band of frequencies if the maximum duration is selected to correspond to the duration of a pulse having the lowest desired frequency, and the minimum duration is selected to correspond to the duration of a pulse having the highest desired frequency.

Figure 2:
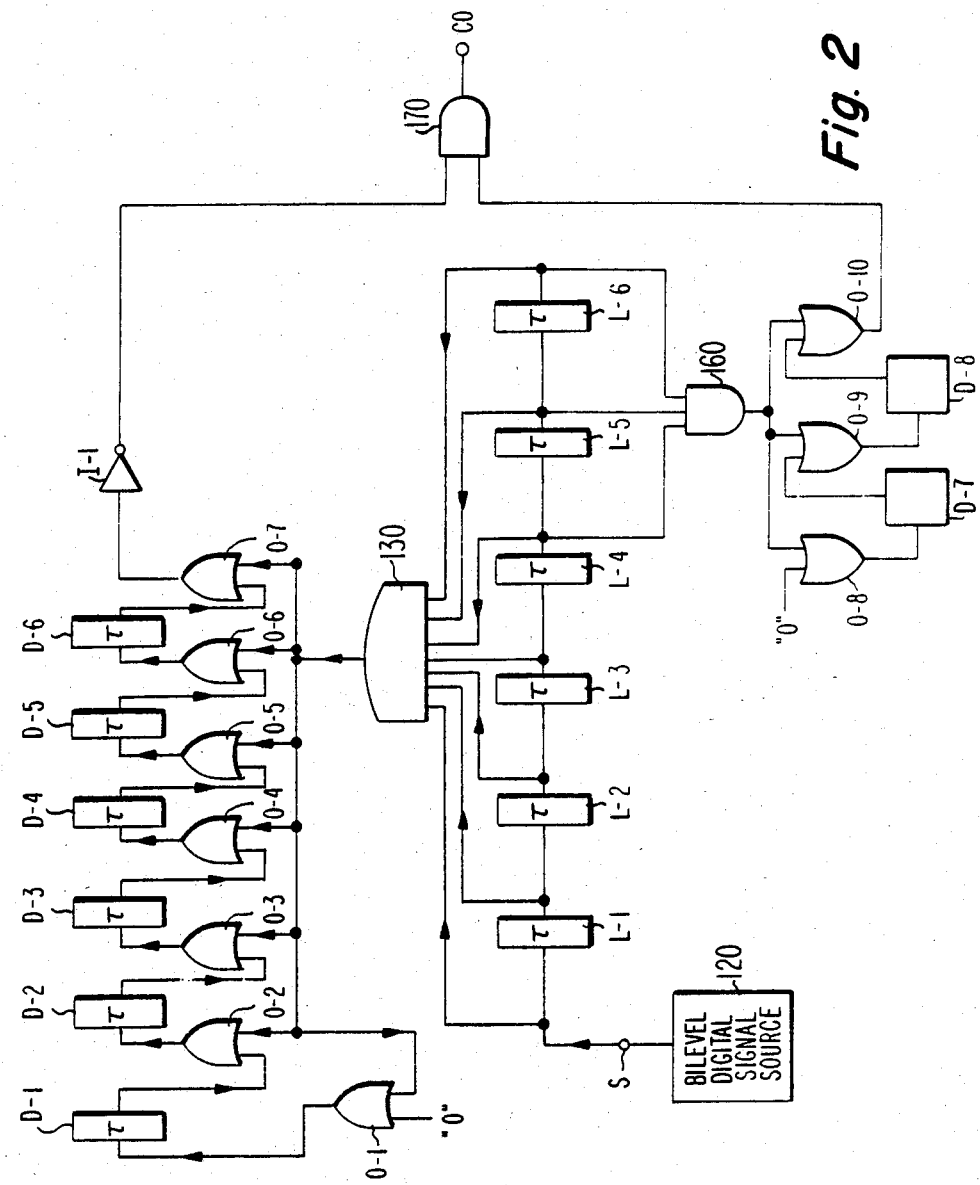

In the drawings:

FIG. 1 is a block diagram of a vertical detail restoration circuit in which a digital pulse width detector according to the principles of the present invention may be used; and FIG. 2 is a schematic diagram of a pulse width detector according to the principles of the present invention which may be used in the circuit illustrated in FIG. 1.

In FIG. 1 a comb filter 5 receives a composite video signal at an input, and produces at respective outputs comb filtered luminance Y and comb filtered chrominance C signals. The comb filtered chrominance signal C is applied to a baseband color difference signal producing means 20, comprising a bandpass filter 24, color decoder 22 and low-pass filter 26. Band-pass filter 24 receives the comb filtered chrominance signal, and passes signals lying in the band of frequencies from 1.2. MHz below the color subcarrier frequency to 0.6 MHz above the color subcarrier frequency. The output of bandpass filter 24 is applied to color decoder 22. The color decoder 22 separates the I color difference signal from the bandpass filtered chrominance signal and generates a baseband I color difference signal. The baseband I color difference signal is applied to low-pass filter 26. The low-pass filter 26 has a pass-band of 1.2 MHz and produces the baseband I signal at its output.

The baseband I signal is applied to a pulse width detector 30. The pulse width detector 30 generates a control signal which represents presence or absence of signal information lying in the frequency band from 0.6 to 1.2 MHz.

The comb filtered chrominance signal C is also applied to a combining means 10 comprising low-pass filters 12 and 14, multiplexer (MUX) 16, and adder 18. First low-pass filter 12 and second low-pass filter 14 each receive the comb filtered chrominance signal C. Low-pass filter 12 has a pass-band of 1.5 MHz and will pass only vertical detail information lying below the range of frequencies which could possibly be occupied by high frequency modulated I information. Low-pass filter 14 has a pass-band of 2.4 MHz and passes low frequency information and the information in the frequency band shared by high frequency modulated I information and high frequency vertical detail information.

The outputs of low-pass filter 12 and low-pass filter 14 are coupled to respective signal inputs of multiplexer 16. The output of pulse width detector 30 is coupled to the control input of multiplexer 16, and the signal output of multiplexer 16 is coupled to one input of an adder 18.

If pulse width detector 30 detects signal information in the frequency band from 0.6 MHz to 1.2 MHz in the baseband I signal, indicating the presence of high frequency I information, multiplexer 16 applies the narrower bandwidth signal from low-pass filter 12 as vertical detail information to adder 18.

If pulse width detector 30 does not detect signal information in the frequency band from 0.6 MHz to 1.2 MHz of the baseband I signal, indicating the absence of high frequency I information, multiplexer 16 applies the wider bandwidth signal from low-pass filter 14 as vertical detail information to adder 18. Adder 18 receives at another input the comb filtered luminance signal Y, and produces at an output the restored luminance signal.

FIG. 2 illustrates a pulse width detector according to the principles of the present invention. In FIG. 2, a source S of bilevel digital signals, such as digitized signals from lowpass filter 26 of FIG. 1, for example, supplies the signals to a cascade connection of a plurality of delay devices L-1 to L-6. In this illustrated embodiment, the signal from low pass filter 26 of FIG. 1 may be digitized by a comparator and threshold signal source (not shown). If the level of the signal from low pass filter 26 exceeds the threshold level, a first level digital signal is produced, and a second level digital signal is produced otherwise. Delay devices L-1 through L-6, and delay devices D-1 through D-8 (discussed below) are all clocked delay devices. All of them are coupled to a source of clock signals (not shown), and all delay signals by one clock period.

An AND gate 160 has inputs coupled to the outputs of each of delay devices L-4 to L-6. The output of AND gate 160 is coupled to one input of each of two-input OR gates O-8 to O-10. OR gates O-8 to O-10 are coupled in an alternating cascade connection with delay devices D-7 and D-8. The inputs of delay devices D-7 and D-8 are coupled to the outputs of OR gates O-8 and O-9 respectively and the outputs of delay devices D-7 and D-8 are coupled to the second input of OR gates O-9 and O-10 respectively. The second input of OR gate O-8 is coupled to a source of "0" digital signal.

Delay devices L-1 through L-6, AND gate 160, OR gates O-8 through O-10, and delay devices D-7 and D-8 form a first duration sensitive signal gate providing an output signal at the output of OR gate O-10. If the signals at the outputs of delay devices L-4 through L-6 are all "1", then the output of AND gate 160 becomes "1", and stays "1" as long as the outputs of delay devices L4 through L6 remain the same. When the output of AND gate 160 is "1", the output of all of OR gates O-8 through O-10 are "1".

Delay stages D-7 and D-8 store the signal at their input and present it at their output at the occurrence of each clock pulse. Thus, so long as the output of AND gate 160 is a "1", a continuous sequence of "1"s will be shifted through the alternating cascade connection of OR gates and delay devices because the output of OR gate O-8 is "1". When the output of AND gate 160 becomes a "0", indicating that a pulse of three periods is not present at delay devices L-4 through L-6, then the output of OR gate O-8 becomes "0". The "0" signal at the output of OR gate O-8, is shifted through the delay devices D-7 and D-8. Two clock periods later, a "0" is output from OR gate O-10. This first duration sensitive signal gate, therefore, passes signal pulses which have a width of three or greater clock periods to the output of OR gate O-10.

A second duration sensitive signal gate is formed by the combination of AND gate 130, OR gates O-1 through O-7, and delay devices D-1 through D-6 with the cascade connection of delay devices L-1 through L-6. AND gate 130 has inputs coupled to the output S of the digital bilevel signal source and the outputs of all of delay devices L-1 through L-6. The output of AND gate 130 is coupled to one input of each of two-input OR gates O-1 through O-7. OR gates O-1 through O-7 and delay devices D-1 through D-6 are coupled in an alternating cascade connection in a similar manner to OR gates O-8 through O-10 and delay devices D-7 and D-8, as described above.

The second duration sensitive signal gate operates in a similar manner to the first duration sensitive signal gate, except that it passes only pulses which have a width of seven or greater clock periods to the output of OR gate O-7.

A signal selector comprises inverter I-1 and AND gate 170. The output of the first duration sensitive signal gate (the output of OR gate O-10) is coupled to one input of AND gate 170. The output of the second duration sensitive signal gate (the output of OR gate O-7) is coupled to the second input of AND gate 170 through inverter I-1.

The output of inverter I-1 is "1" unless the second duration sensitive signal gate passes a pulse, in which case it becomes "0" for the width of the pulse. The signal at the output of AND gate 170 will only be "1" when the first duration sensitive signal gate is passing a pulse and the second duration sensitive signal gate is not passing a pulse. The output of AND gate 170 can only be pulses having widths greater than or equal to three clock periods but less than seven clock periods.

The illustrated embodiment of a pulse width detector in accordance with the present invention has been described as operating upon an analog signal which has been digitized in an asynchronous manner, and then clocked into the delay devices. The pulse width of a signal which either was originally a digital signal, or which was digitized in a synchronous manner may also be detected by apparatus in accordance with the present invention.

What is claimed is:

1. In a digital signal processing system, including a source of bilevel digital signals, a digital pulse width detector, comprising:
a first duration sensitive signal gate coupled to said source of bilevel digital signals, for passing only pulses having widths greater than a first given duration;
a second duration sensitive signal gate coupled to said source of bilevel digital signals, for passing only pulses having widths greater than a second given duration greater than said first given duration; and
signal selection means coupled to said first and second duration sensitive signal gates for passing only pulses which have passed through said first duration sensitive signal gate and which have not passed through said second duration sensitive signal gate.

2. In a digital signal processing system, including a source of bilevel digital signals, a digital pulse width detector, comprising:
a first duration sensitive signal gate coupled to said source of bilevel digital signals, for passing only pulses having widths greater than a first given duration, and including a serial connection of a first plurality of delay devices forming junctions therebetween, said serial connection having an input terminal coupled to said source of bilevel digital signals, an output terminal, and a plurality of output taps respectively coupled to said input terminal, said output terminal, and said junctions, an AND gate having a plurality of inputs coupled to respective ones of said output taps of said serial connection, and an output, and a cascade connection of a plurality of two input OR gates alternating with a second plurality of delay devices wherein first input terminals of respective OR gates are coupled to output terminals of respective delay devices, the output terminals of respective OR gates are coupled to input terminals of respective delay devices, and the second input terminals of all of said OR gates are coupled to the output terminal of said AND gate;
a second duration sensitive signal gate coupled to said source of bilevel digital signals, for passing only pulses having widths greater than a second given duration greater than said first given duration; and
signal selection means coupled to said first and second duration sensitive signal gates for passing only pulses which have passed through said first duration sensitive signal gate and which have not passed through said second duration sensitive signal gate.

3. In a digital signal processing system, including a source of bilevel digital signals, a digital pulse width detector, comprising:
a first duration sensitive signal gate coupled to said source of bilevel digital signals, for passing only pulses having widths greater than a first given duration;
a second duration sensitive signal gate coupled to said source of bilevel digital signals, for passing only pulses having widths greater than a second given duration greater than said first given duration, including a serial connection of a first plurality of delay devices forming junctions therebetween, said serial connection having an input terminal coupled to said source of bilevel digital signals, an output terminal, and a plurality of output taps respectively coupled to said input terminal, said output terminal, and said junctions, an AND gate having a plurality of inputs coupled to respective ones of said output taps of said serial connection, and an output, and a cascade connection of a plurality of two input OR gates alternating with a second plurality of delay devices wherein first input terminals of respective OR gates are coupled to output terminals of respective delay devices, the output terminals of respective OR gates are coupled to input terminals of respective delay devices, and the second input terminals of all of said OR gates are coupled to the output terminal of said AND gate; and signal selection means coupled to said first and second duration sensitive signal gates for passing only pulses which have passed through said first duration signal gate and which have not passed through said second duration signal gate.

4. In a digital signal processing system, including a source of bilevel digital signals, a digital pulse width detector, comprising:

a first duration sensitive signal gate coupled to said source of bilevel digital signals, for passing only pulses having widths greater than a first given duration;

a second duration sensitive signal gate coupled to said source of bilevel digital signals, for passing only pulses having widths greater than a second given duration greater than said first given duration; and signal selection means coupled to said first and second duration sensitive signal gates for passing only pulses which have passed through said first duration sensitive signal gate and which have not passed through said second duration sensitive signal gate, including an inverter having an input coupled to said second duration sensitive signal gate, and an output, and an AND gate having a first input coupled to said first duration sensitive signal gate, a second input coupled to the output of said inverter, and an output at which pulse width detected signals are produced.

* * * * *